United States Patent

McMillan et al.

(10) Patent No.: US 10,338,180 B2
(45) Date of Patent: Jul. 2, 2019

(54) SYSTEM AND METHOD FOR GRADIENT MEASUREMENT USING SINGLE-POINT IMAGING

(71) Applicant: Wisconsin Alumni Research Foundation, Madison, WI (US)

(72) Inventors: Alan B. McMillan, Madison, WI (US); Hyungseok Jang, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 651 days.

(21) Appl. No.: 14/881,093

(22) Filed: Oct. 12, 2015

(65) Prior Publication Data

US 2017/0102439 A1   Apr. 13, 2017

(51) Int. Cl.
*G01R 33/24* (2006.01)
*G01R 33/565* (2006.01)
*G01R 33/385* (2006.01)
*G01R 33/389* (2006.01)
*G01R 33/48* (2006.01)

(52) U.S. Cl.
CPC ..... *G01R 33/56572* (2013.01); *G01R 33/243* (2013.01); *G01R 33/4816* (2013.01); *G01R 33/4824* (2013.01)

(58) Field of Classification Search
CPC .... G01R 33/24; G01R 33/389; G01R 33/565; G01R 33/385
See application file for complete search history.

(56) References Cited

U.S. PATENT DOCUMENTS

2011/0241673 A1* 10/2011 Lin .................... G01R 33/5611
324/309
2011/0254548 A1* 10/2011 Setsompop ........ G01R 33/4835
324/309
2016/0307301 A1* 10/2016 Zhou .................. G01R 33/4836

OTHER PUBLICATIONS

Ahn, et al., Analysis of the eddy-current induced artifacts and the temporal compensation in nuclear magnetic resonance imaging, IEEE Trans. Med. Imaging 1991;10:47-52.
(Continued)

*Primary Examiner* — Jermele M Hollington
*Assistant Examiner* — Suresh K Rajaputra
(74) *Attorney, Agent, or Firm* — Quarles & Brady LLP

(57) ABSTRACT

A system and method for determining an actual gradient field generated by a magnetic resonance imaging (MRI) system when controlled to produce a prescribed gradient field is provided. The techniques include using the prescribed gradient field, controlling the MRI system to perform a phase encoding including a gradient that is scaled along each direction desired to be measured over a selected number of encoding times and acquiring one-dimensional (1D) data using a prescribed k-space trajectory during the phase encoding. The 1D data is used to determine scaling factors between encoding times that correlate to actual k-space trajectories achieved when controlling the gradient coils to perform the phase encoding based on the desired gradient field and a report is generated that provides a measure of the actual gradient field generated when controlling the MRI system to produce the prescribed gradient field.

21 Claims, 8 Drawing Sheets

(56) References Cited

OTHER PUBLICATIONS

Bakker, et al. Multiple single-point imaging (mSPI) as a tool for capturing and characterizing MR signals and repetitive signal disturbances with high temporal resolution: The MRI scanner as a high-speed camera, Mag. Res. Imaging, 2013 31(7):1037-1043.
Balcom, et al., Single-Point Imaging of Gradient Rise, Stabilization, and Decay. J. Magn. Reson. Ser. A 1996;118:122-125.
Balcom, et al., Single-Point Ramped Imaging with T1 Enhancement (SPRITE). J. Magn. Reson. Ser. A 1996;123:131-134.
Barmet, et al., Spatiotemporal magnetic field monitoring for MR. Magn. Reson. Med. 2008;60:187-197.
Beatty, et al., Rapid gridding reconstruction with a minimal oversampling ratio. IEEE Trans. Med. Imaging 2005;24:799-808.
Bernstein, et al., Concomitant gradient terms in phase contrast MR: Analysis and correction, Magn. Reson. Med. 1998;39:300-308.
Boesch, et al., Temporal and Spatial Analysis of Fields Generated by Eddy Currents in Superconducting Magnets: Optimization of Corrections and Quantitative Characterization of Magnet/Gradient Systems. Magnetic Resonance in Medicine, 1991, vol. 20, pp. 268-284.
Brodsky, et al., Characterizing and correcting gradient errors in non-Cartesian imaging: Are gradient errors Linear Time-Invariant (LTI)? Magn. Reson. Med. 2009;62:1466-1476.
Chebrolu, et al., Noise analysis for 3-point chemical shift-based water-fat separation with spectral modeling of fat. J. Magn. Reson. Imaging 2010;32:493-500.
Cheng, et al., Fast concomitant gradient field and field inhomogeneity correction for spiral cardiac imaging. Magn. Reson. Med. 2011;66:390-401.
Cho, et al., A new silent magnetic resonance imaging using a rotating DC gradient. Magn. Reson. Med. 1998;39:317-321.
De Zanche, et al., NMR Probes for measuring magnetic fields and field dynamics in MR systems. Magn. Reson. Med. 2008;60:176-186.
Du, et al., Ultrashort echo time (UTE) magnetic resonance imaging of the short T2 components in white matter of the brain using a clinical 3T scanner Neuroimage 2014;87:32-41.
Du, et al., Correction of concomitant magnetic field-induced image artifacts in nonaxial echo-planar imaging. Magn. Reson. Med. 2002;48:509-515.
Duyn, et al., Simple correction method for k-space trajectory deviations in MRI. J. Magn. Reson. 1998;132:150-153. doi: 10.1006/jmre.1998.1396.
Emid, et al., High resolution NMR imaging in solids, Phys. B+C 1985;128:81-83. doi: 10.1016/0378-4363(85)90087-7.
Foerster, et al., Magnetic field shift due to mechanical vibration in functional magnetic resonance imaging, Magn. Reson. Med. 2005;54:1261-1267.
Gach, et al., A programmable pre-emphasis system, Magn. Reson. Med. 1998;40:427-431.
Gibiino, et al., Free-breathing, zero-TE MR lung imaging. Magn. Reson. Mater. Physics, Biol. Med. 2014.
Goodyear, et al., Single point measurements of magnetic field gradient waveform. J. Magn. Reson. 2003;163:1-7.
Grodzki, et al., Correcting slice selectivity in hard pulse sequences. J. Magn. Reson. 2012;214:61-7.
Grodzki, et al., Ultrashort echo time imaging using pointwise encoding time reduction with radial acquisition (PETRA), Magn. Reson. Med. 2012;67:510-8.
Hafner, Fast imaging in liquids and solids with the Back-projection Low Angle ShoT (BLAST) technique. Magn. Reson. Imaging 1994;12:1047-1051.
Halse, et al., Centric scan SPRITE magnetic resonance imaging. J. Magn. Reson. 2003;165:219-229.
Hammer, Magnetic field mapping with an array of nuclear magnetic resonance probes. Rev. Sci. Instrum. 1996;67:2378.
Han, et al., Pure phase encode magnetic field gradient monitor. J. Magn. Reson. 2009;201:212-217.

Heba, et al., Agreement of 2-, 3-, 4-, 5- and 6-echo MRI-PDFF with MRS-PDFF in 580 adults with known or suspected non-alcoholic fatty liver disease (NAFLD). In: Intl. Soc. Mag. Reson. Med. vol. 22. Milan, Italy; 2014. p. 0138.
Hennel, et al., "Silent" MRI with soft gradient pulses. Magn. Reson. Med. 1999;42:6-10.
Hennel, Fast spin echo and fast gradient echo MRI with low acoustic noise. J. Magn. Reson. Imaging 2001;13:960-6.
Hövener, et al., Dental MRI: imaging of soft and solid components without ionizing radiation. J. Magn. Reson. Imaging 2012;36:841-6.
Huang, et al., T2 mapping from highly undersampled data by reconstruction of principal component coefficient maps using compressed sensing. Magn. Reson. Med. 2012;67:1355-66.
Idiyatullin, et al., Multi-Band-SWIFT. J. Magn. Reson. 2014, pp. 19-25.
Idiyatullin, et al., Fast and quiet MRI using a swept radiofrequency. J. Magn. Reson. 2006;181:342-9.
Jang, et al., Accelerated 4D quantitative single point EPR imaging using model-based reconstruction. Magn. Reson. Med. 2014;00:1-10.
Jang, et al., Single acquisition quantitative single-point electron paramagnetic resonance imaging, Magn. Reson. Med. 2013;70:1173-1181.
Jehenson, et al., Analytical method for the compensation of eddy-current effects induced by pulsed magnetic field gradients in NMR systems. J. Magn. Reson. 1990;90:264-278.
Johnson, et al., Optimized 3D ultrashort echo time pulmonary MRI. Magn. Reson. Med. 2013;70:1241-1250.
Johnson, et al., Convolution kernel design and efficient algorithm for sampling density correction. Magn. Reson. Med. 2009;61:439-47.
Kaffanke, et al., Multi-Frame SPRITE: A method for resolution enhancement of multiple-point SPRITE data. J. Magn. Reson. 2013;230C:111-116.
King, et al., Concomitant gradient field effects in spiral scans. Magn. Reson. Med. 1999;41:103-112.
Kuethe, et al., Imaging lungs using inert fluorinated gases. Magn. Reson. Med. 1998;39:85-88.
Li, et al., Correction of excitation profile in zero echo time (ZTE) imaging using quadratic phase-modulated RF pulse excitation and iterative reconstruction. IEEE Trans. Med. Imaging 2014;33:961-969.
Lustig, et al., Sparse MRI: The application of compressed sensing for rapid MR imaging, Magn. Reson. Med. 2007;58:1182-95.
Lustig, et al., Compressed Sensing MRI. Signal Process. Mag. 2008:72-82.
Madio, et al., Ultra-fast imaging using low flip angles and fids. Magn. Reson. Med. 1995;34:525-529.
Matsumoto, et al., Electron paramagnetic resonance imaging of tumor hypoxia: enhanced spatial and temporal resolution for in vivo pO2 determination. Magn. Reson. Med. 2006;55:1157-63.
Meier, et al., Concomitant field terms for asymmetric gradient coils: Consequences for diffusion, flow, and echo-planar imaging, Magn. Reson. Med. 2008;60:128-134.
Papadakis, et al., Gradient preemphasis calibration in diffusion-weighted echo-planar imaging. Magn. Reson. Med. 2000;44:616-624.
Pineda, et al., Cramer-Rao bounds for three-point decomposition of water and fat, Magn. Reson. Med. 2005;54:625-635.
Pipe, et al., Sampling density compensation in MRI: rationale and an iterative numerical solution. Magn. Reson. Med. 1999;41:179-86.
Pipe, Reconstructing MR images from undersampled data: data-weighting considerations. Magn. Reson. Med. 2000; vol. 43(6):867-75.
Rahmer, et al., Three-dimensional radial ultrashort echo-time imaging with T2 adapted sampling. Magn. Reson. Med. 2006;55:1075-1082.
Reeder, et al., Iterative decomposition of water and fat with echo asymmetry and least-squares estimation (IDEAL): application with fast spin-echo imaging. Magn. Reson. Med. 2005;54:636-44.
Robson, et al., Clinical ultrashort echo time imaging of bone and other connective tissues. NMR Biomed. 2006;19:765-80.

(56) References Cited

OTHER PUBLICATIONS

Schieban, et al., ZTE imaging with enhanced flip angle using modulated excitation. Magn. Reson. Med. 2014;00:1-10.

Sica, et al., Concomitant gradient field effects in balanced steady-state free precession. Magn. Reson. Med. 2007;57:721-730.

Subramanian, et al., Single-point (constant-time) imaging in radiofrequency Fourier transform electron paramagnetic resonance. Magn. Reson. Med. 2002;48:370-9.

Tan, et al., Estimation of k-space trajectories in spiral MRI. Magn. Reson. Med. 2009;61:1396-1404.

Tyler, et al., Magnetic resonance imaging with ultrashort TE (UTE) PULSE sequences: technical considerations. J. Magn. Reson. Imaging 2007;25:279-89.

Van de Moortele, et al., Respiration-induced B0 fluctuations and their spatial distribution in the human brain at 7 Tesla. Magn. Reson. Med. 2002;47:888-895.

Vannesjo, et al., Gradient system characterization by impulse response measurements with a dynamic field camera. Magn. Reson. Med. 2013;69:583-93.

Vannesjo, et al., Image reconstruction using the gradient impulse response for trajectory prediction. Magnetic Resonance in Medicine 76:45-58 (2016).

Versluis, et al., Origin and reduction of motion and f0 artifacts in high resolution T2*-weighted magnetic resonance Imaging: application in Alzheimer's disease patients. Neuroimage 2010;51:1082-1088.

Waldman, et al., MRI of the brain with ultra-short echo-time pulse sequences. Neuroradiology 2003;45:887-92.

Weiger, et al., High-resolution ZTE imaging of human teeth. NMR Biomed. 2012;25:1144-51.

Weiger, et al., Direct depiction of bone microstructure using MRI with zero echo time. Bone 2013;54:44-7.

Wiesinger F, Sacolick LI, Menini A, Kaushik SS, Ahn S, Veithaibach P, Delso G, Shanbhag DD. Zero TE MR Bone Imaging in the Head. Magn. Reson. Med. 2015;00:n/a-n/a. doi: 10.1002/mrm.25545.

Wu, et al., Density of organic matrix of native mineralized bone measured by water- and fat-suppressed proton projection MRI. Magn. Reson. Med. 2003;50:59-68.

Wu, et al., Gradient-induced acoustic and magnetic field fluctuations in a 4T whole- body MR imager. Magn Reson Med 2000;44:532-6.

Wurnig, et al., Characterization of trabecular bone density with ultra-short echo-time MRI at 1.5, 3.0 and 7.0 T—comparison with micro-computed tomography. NMR Biomed. 2014;27:1159-66.

Wysong, et al., A novel eddy current compensation scheme for pulsed gradient systems. Magn. Reson. Med. 1994;31:572-575.

Xiao, et al., Hybrid-SPRITE MRI. J. Magn. Reson. 2013;235:6-14.

Zhang, et al., Gradient-modulated SWIFT. Magn. Reson. Med. 2016; 75(2): 537-546.doi:10.1002/mrm.25595.

Zhou, et al., Concomitant magnetic-field-induced artifacts in axial echo planar imaging. Magn. Reson. Med. 1998;39:596-605.

* cited by examiner

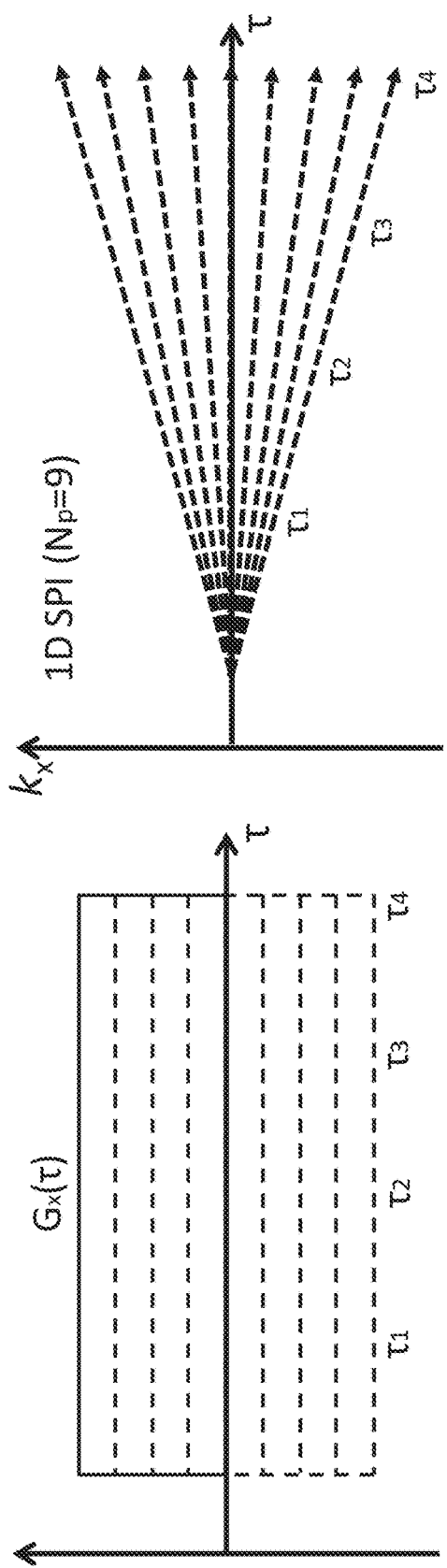
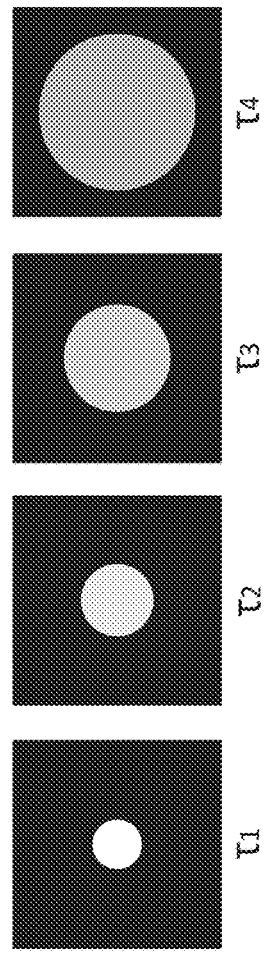
FIG. 2A
FIG. 2B
FIG. 2C

SYSTEM AND METHOD FOR GRADIENT MEASUREMENT USING SINGLE-POINT IMAGING

STATEMENT REGARDING FEDERALLY SPONSORED RESEARCH

This invention was made with government support under EB013770 awarded by the National Institutes of Health. The government has certain rights in the invention.

CROSS-REFERENCE TO RELATED APPLICATIONS

N/A

BACKGROUND

The present disclosure relates to systems and methods for magnetic resonance imaging ("MRI") and, more particularly, to systems and methods assessing actual gradients applied by an MRI system.

When a substance such as human tissue is subjected to a uniform magnetic field (polarizing field $B_0$), the individual magnetic moments of the nuclear spins in the tissue tend to align with this polarizing field. If they are not initially aligned precisely with the polarizing field, they will precess about the field at their characteristic Larmor frequency as a top precesses about the Earth's gravitational field if the top's spin axis is not initially aligned with the field. Usually the nuclear spins are the nuclei of hydrogen atoms, but NMR active nuclei of other elements are occasionally used. At equilibrium, the individual magnetic moments of all the nuclei combine to produce a net magnetic moment $M_z$ in the direction of the polarizing field, but the randomly oriented magnetic components in the perpendicular, or transverse, plane (x-y plane) cancel one another. If, however, the substance, or tissue, is subjected to a magnetic field (excitation field $B_1$; also referred to as the radiofrequency (RF) field) which is in the x-y plane and which oscillates near the Larmor frequency, the net aligned moment, $M_z$, may be rotated, or "tipped", into the x-y plane to produce a net transverse magnetic moment $M_t$, which precesses (rotates about the $B_0$ field direction) in the x-y plane at the Larmor frequency. The typically brief application of the $B_1$ field that accomplishes the tipping of the nuclear spins is generally known as an RF pulse. The practical value of this phenomenon resides in the signal which is emitted by the excited spins after the excitation field $B_1$ is terminated. There is a wide variety of measurement pulse sequences ("sequences") in which this nuclear magnetic resonance ("NMR") phenomenon is exploited.

When utilizing these signals to produce images, the phenomenon is generally known as magnetic resonance imaging ("MRI"), and magnetic field gradients ($G_x$, $G_y$, and $G_z$) of the polarizing field $B_0$ are employed. Typically, the region to be imaged experiences a sequence of measurement cycles in which these gradients vary according to the particular localization method being used. The emitted MRI signals are detected using a receiver coil. The MRI signals are then digitized and processed to reconstruct the image using one of many well-known reconstruction techniques.

Thus, the gradient system is an essential component of an MRI system. It performs spatial and temporal encoding of transverse magnetization through a spatially grading magnetic field. Gradient waveforms can be synthesized to perform a range of encoding strategies including conventional Cartesian image encoding, as well as non-Cartesian acquisitions such as radial and spiral. Despite generally being considered so, the gradient fields used for spatial encoding in clinical MRI systems are never truly linear over the imaging field-of-view ("FOV"). There are many technical factors that inevitably cause distortions in the realized gradient magnetic field, including eddy currents, mechanical/thermal vibrations, and physiologically induced magnetic fields, to name a few. These unwanted gradient distortions present an engineering challenge to realizing the actual gradient field relative to the prescribed gradient. Differences between the prescribed gradients and the actual gradients result in image artifacts, including blurriness, ringing, or phase error, to name a few.

Certain MRI techniques are more prone gradient distortions and images that suffer from gradient distortions. For example, gradient distortions can be a critical issue in non-Cartesian acquisitions, and can be further exacerbated in acquisition schemes with long readout durations, such as spiral or echo planar imaging (EPI). In these cases, the k-space trajectory is prone to deviation from the prescribed trajectory due to the accumulated error in the phase evolution of the distorted gradient. In addition, rapidly changing large gradient amplitudes generate time-varying concomitant gradients that are another source of error that distort k-space trajectory.

As such, many methods have been proposed to estimate the actual k-space trajectory. These methods can generally be classified into three major categories. A first category is frequency-encoding based methods (FEBM), where off-centered selection of a thin slice is performed to avoid signal dephasing effects caused by the gradient, followed by measurement of the phase evolution over the encoding time in the manner of frequency encoding. Although the efficacy of this measurement scheme has been verified in many critical studies, the methods suffer from limitations such as the dependency on slice selection and T2* decay. A second category is phase encoding based methods (PEBM), where the phase evolution is measured at a constant (and single) echo time after a RF pulse, which is advantageous in terms of reducing the impact of T2* decay. However, a series of RF pulses must be applied to measure the whole gradient, which limits the attainable resolution of gradient measurement that directly depends on the number of RF pulse and phase encoding time delay. The third category is external probe based methods (EPBM), extra hardware is added to the MRI system to measure the gradients at various, pre-determined positions and extrapolate the actual gradients from these measurements. That is, in EPBM, several MR field probes are deployed about the MRI system and used to record field characteristics temporally and spatially. Of course, adding additional hardware to the MRI system increases the cost and complexity of the MRI system.

Once the actual gradients are at least generally known, there are several ways to correct for the deviation of the k-space trajectory. In current generation MR systems, it is common to perform pre-emphasis correction by inputting a filtered waveform into the gradient subsystem to enable a more desirable output waveform. That is, the pre-emphasis augments the idealized, often-linear gradient signal, to pre-compensate for expected gradient variations. Gradient systems are generally characterizable as linear time invariant (LTI) systems, allowing such approaches to be used. An extension of the LTI concept utilizes a gradient impulse response function (GIRF) to deconvolve the prescribed gradient from the measured gradient. Utilizing a comprehensive calibration dataset, GIRF allows a flexible correction for gradient errors, where the distorted gradient shape can be estimated by convolving the estimated GIRF with the prescribed gradient. Even with all these efforts, reconstructed images can exhibit geometric distortion unless efforts are taken to account for gradient deviations.

Therefore, it would be desirable to have systems and methods for accurately determining actual gradients in an MRI system and using this information to improve clinical images.

SUMMARY

The present disclosure provides systems and methods for measuring gradients without the need for slice selection, additional equipment, or knowledge about the imaged subject. Instead, a single point imaging (SPI) technique is implemented by linearly scaling the gradient amplitude with each repetition time, so as to implement phase encoding. Then, the relative FOV scaling factor can be measured by adaptively using k-space and/or image domain data to estimate the k-space trajectory. The measured k-space trajectory can then be utilized in reconstruction to provide improved image quality.

In accordance with one aspect of the disclosure, a magnetic resonance imaging (MRI) system is disclosed. The MRI system includes a magnet system configured to generate a polarizing magnetic field about at least a portion of a subject arranged in the MRI system, a plurality of gradient coils configured to apply a gradient field to the polarizing magnetic field, and a radio frequency (RF) system configured to apply an excitation field to the subject and acquire MR image data therefrom. The MRI system also includes a computer system programmed to determining an actual gradient field generated by the plurality of gradient coils when controlled to produce a prescribed gradient field. The computer system is configured to do so by controlling the gradient coils, based on a desired gradient field, to perform a phase encoding including a gradient that is scaled along each direction desired to be measured over a selected number of encoding times. The computer system is further programmed to do so by controlling the RF system to acquire one-dimensional (1D) data using a prescribed k-space trajectory during the phase encoding and, using the 1D data, determining scaling factors between encoding times that correlate to actual k-space trajectories achieved when controlling the gradient coils to perform the phase encoding based on the desired gradient field. The computer system is further configured to do so by generating a report providing a measure of the actual gradient field generated by the plurality of gradient coils when controlled to produce the prescribed gradient field.

In accordance with another aspect of the disclosure, a method is provided for determining an actual gradient field generated by a magnetic resonance imaging (MRI) system when controlled to produce a prescribed gradient field. The method includes using the prescribed gradient field, controlling the MRI system to perform a phase encoding including a gradient that is scaled along each direction desired to be measured over a selected number of encoding times and acquiring one-dimensional (1D) data using a prescribed k-space trajectory during the phase encoding. The method also includes using the 1D data, determining scaling factors between encoding times that correlate to actual k-space trajectories achieved when controlling the gradient coils to perform the phase encoding based on the desired gradient field and generating a report providing a measure of the actual gradient field generated when controlling the MRI system to produce the prescribed gradient field.

In accordance with yet another aspect of the disclosure, a method is provided for determining a difference between an actual gradient field generated by a magnetic resonance imaging (MRI) system and a prescribed gradient field. The method includes performing a pulse sequence using the MRI system that includes a single point imaging (SPI) acquisition to acquire imaging data over a plurality of encoding times and analyzing a zoon-in/out effect using the imaging data to determine a relative field of view (FOV) scaling factor between the encoding times. The method also includes using the FOV scaling factor, determine relative k-space positions of at least one of the imaging data and to-be acquired imaging data and generating an image using one of the imaging data and the to-be acquired imaging data and the relative k-space positions.

The foregoing and other aspects and advantages of the invention will appear from the following description. In the description, reference is made to the accompanying drawings that form a part hereof, and in which there is shown by way of illustration a preferred embodiment of the invention. Such embodiment does not necessarily represent the full scope of the invention, however, and reference is made therefore to the claims and herein for interpreting the scope of the invention.

BRIEF DESCRIPTION OF THE DRAWINGS

FIG. 2A is a graphic illustration of a phase encoding gradient for single point imaging.

FIG. 2B is a graph showing the k-space trajectory associated with the gradient of FIG. 2A.

FIG. 2C is a series of images illustrating the zoom-in effect in spatial domain.

DETAILED DESCRIPTION

Figure 1:
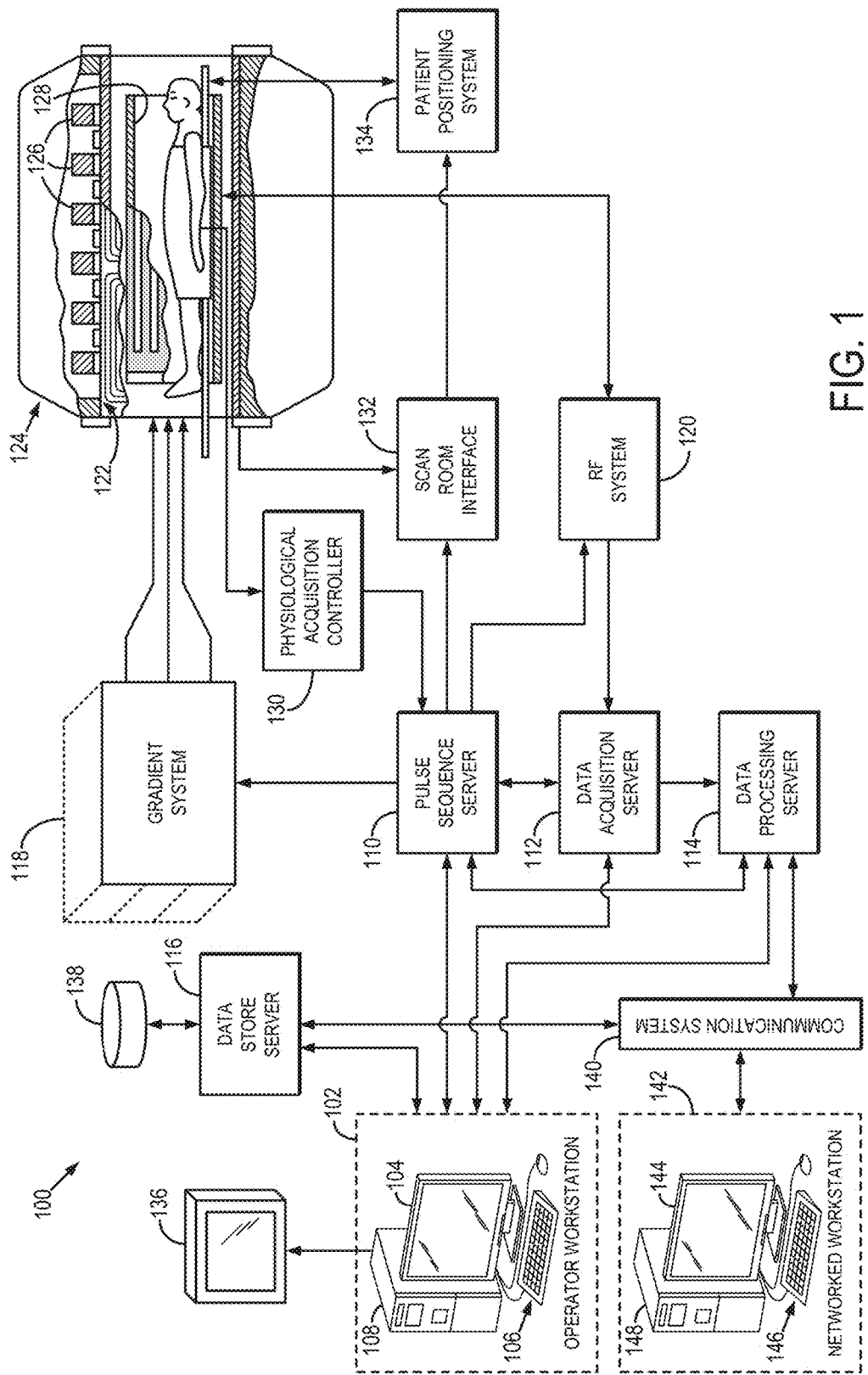
FIG. 1 is a block diagram of an example of a magnetic resonance imaging ("MRI") system in accordance with the present disclosure.

Referring particularly to FIG. 1, an example of a magnetic resonance imaging (MRI) system 100 is illustrated. The MRI system 100 includes a workstation 102 having a display 104 and a keyboard 106. The workstation 102 includes a processor 108 that is commercially available to run a commercially-available operating system. The workstation 102 provides the operator interface that enables scan prescriptions to be entered into the MRI system 100. The workstation 102 is coupled to four servers: a pulse sequence server 110; a data acquisition server 112; a data processing server 114; and a data store server 116. The workstation 102 and each server 110, 112, 114, and 116 are connected to communicate with each other.

The pulse sequence server 110 functions in response to instructions downloaded from the workstation 102 to operate a gradient system 118 and a radiofrequency (RF) system 120. Gradient waveforms necessary to perform the prescribed scan are produced and applied to the gradient system 118, which excites gradient coils in an assembly 122 to produce the magnetic field gradients $G_x$, $G_y$, and and $G_z$ used for position encoding MR signals. The gradient coil assembly 122 forms part of a magnet assembly 124 that includes a polarizing magnet 126 and a whole-body RF coil 128 or local coil.

RF excitation waveforms are applied to the RF coil 128, or a separate local coil, such as a head coil, by the RF system 120 to perform the prescribed magnetic resonance pulse sequence. Responsive MR signals detected by the RF coil 128, or a separate local coil, are received by the RF system 120, amplified, demodulated, filtered, and digitized under direction of commands produced by the pulse sequence server 110. The RF system 120 includes an RF transmitter for producing a wide variety of RF pulses used in MR pulse sequences. The RF transmitter is responsive to the scan prescription and direction from the pulse sequence server 110 to produce RF pulses of the desired frequency, phase, and pulse amplitude waveform. The generated RF pulses may be applied to the whole body RF coil 128 or to one or more local coils or coil arrays.

The RF system 120 also includes one or more RF receiver channels. Each RF receiver channel includes an RF preamplifier that amplifies the MR signal received by the coil 128 to which it is connected, and a detector that detects and digitizes the quadrature components of the received MR signal. The magnitude of the received MR signal may thus be determined at any sampled point by the square root of the sum of the squares of the I and Q components:

$$M=\sqrt{I^2+Q^2} \quad (1);$$

and the phase of the received MR signal may also be determined:

$$\varphi = \tan^{-1}\left(\frac{Q}{I}\right). \quad (2)$$

The pulse sequence server 110 also optionally receives patient data from a physiological acquisition controller 130. The controller 130 receives signals from a number of different sensors connected to the patient, such as electrocardiograph (ECG) signals from electrodes, or respiratory signals from a bellows or other respiratory monitoring device. Such signals may be used by the pulse sequence server 110 to synchronize, or "gate," the performance of the scan with the subject's heart beat or respiration.

The pulse sequence server 110 also connects to a scan room interface circuit 132 that receives signals from various sensors associated with the condition of the patient and the magnet system. It is also through the scan room interface circuit 132 that a patient positioning system 134 receives commands to move the patient to desired positions during the scan.

The digitized MR signal samples produced by the RF system 120 are received by the data acquisition server 112. The data acquisition server 112 operates in response to instructions downloaded from the workstation 102 to receive the real-time MR data and provide buffer storage, such that no data is lost by data overrun. In some scans, the data acquisition server 112 does little more than pass the acquired MR data to the data processor server 114. However, in scans that require information derived from acquired MR data to control the further performance of the scan, the data acquisition server 112 is programmed to produce such information and convey it to the pulse sequence server 110. For example, during prescans, MR data is acquired and used to calibrate the pulse sequence performed by the pulse sequence server 110. Also, navigator signals may be acquired during a scan and used to adjust the operating parameters of the RF system 120 or the gradient system 118, or to control the view order in which k-space is sampled.

The data processing server 114 receives MR data from the data acquisition server 112 and processes it in accordance with instructions downloaded from the workstation 102. Such processing may include, for example: Fourier transformation of raw k-space MR data to produce two or three-dimensional images; the application of filters to a reconstructed image; the performance of a backprojection image reconstruction of acquired MR data; the generation of functional MR images; and the calculation of motion or flow images.

Images reconstructed by the data processing server 114 are conveyed back to the workstation 102 where they are stored. Real-time images are stored in a data base memory, from which they may be output to the operator display 104 or a display 136 that is located near the magnet assembly 124 for use by attending physicians. Batch mode images or selected real time images are stored in a host database on disc storage 138. When such images have been reconstructed and transferred to storage, the data processing server 114 notifies the data store server 116 on the workstation 102. The workstation 102 may be used by an operator to archive the images, produce films, or send the images via a network or communication system 140 to other facilities that may include other networked workstations 142.

The communications system 140 and networked workstation 142 may represent any of the variety of local and remote computer systems that may be included within a given clinical or research facility including the system 100 or other, remote location that can communicate with the system 100. In this regard, the networked workstation 142 may be functionally and capably similar or equivalent to the operator workstation 102, despite being located remotely and communicating over the communication system 140. As such, the networked workstation 142 may have a display 144 and a keyboard 146. Also, the networked workstation 142 may be a mobile device, including a laptop, phone, or tablet, that has corresponding user interfaces and, in some cases, reduced control and functionality compared to the operator workstation 102. The networked workstation 142 includes a processor 148 that is commercially available to run a commercially-available operating system. The networked workstation 142 may be able to provide the operator interface that enables scan prescriptions to be entered into the MRI system 100.

As will be described, the present disclosure provides a new phase encoding based method (PEBM) that utilizes 1D single point imaging (SPI) reconstructed across a range of phase encoding time delays. That is, the present disclosure provides a system and method for determining an actual gradient field generated by the plurality of gradient coils when controlled to produce a prescribed gradient field.

In SPI, the field of view (FOV) at phase encoding time delay ($t_p$) is determined by the following equation:

$$FOV(t_p) = \frac{N_p}{\bar{\gamma} \int_0^{t_p} G(\tau) d\tau}; \quad (3)$$

where $N_p$ is the number of phase encoding, $\bar{\gamma}$ is a gyromagnetic ratio, and $G(\tau)$ is a maximum amplitude of phase encoding gradient at time delay $\tau$. Therefore, the FOV in SPI changes over phase encoding time delay depending on the accumulated phase, exhibiting a zoom-in (time decreasing FOV) or zoom-out (time increasing FOV) effect. Specifically, as shown in FIGS. 2A-2C, the zoom-in effect in single point imaging (SPI) is illustrated. In FIG. 2A, the phase encoding gradient for SPI is shown, which is simply a stepped gradient in a given direction extending over multiple time delays. In the non-limiting example included in FIG. 2A, the direction is the x-direction. In FIG. 2B, the k-space trajectory associated with the application of the gradient of FIG. 2A is illustrated. Turning to FIG. 2C, images at each time period are provided that illustrate the zoom-in effect in spatial domain. Note that the FOV change directly reflects the gradient shape. Since constant gradients are applied in this example, FOV change likewise constant over the encoding time.

Figure 3:
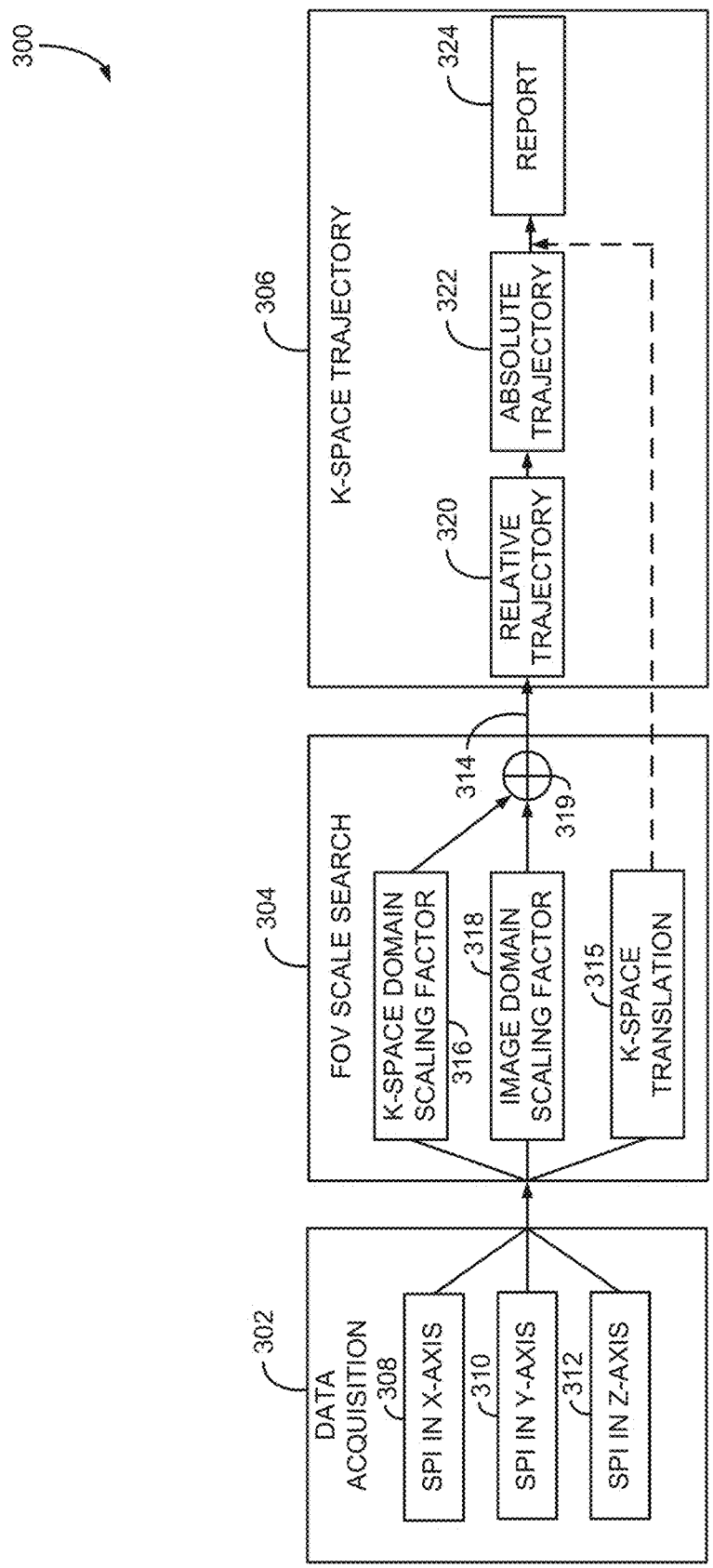
FIG. 3 is a flow chart setting forth an example of steps that may be taken in accordance with the present disclosure.
Figure 4A:
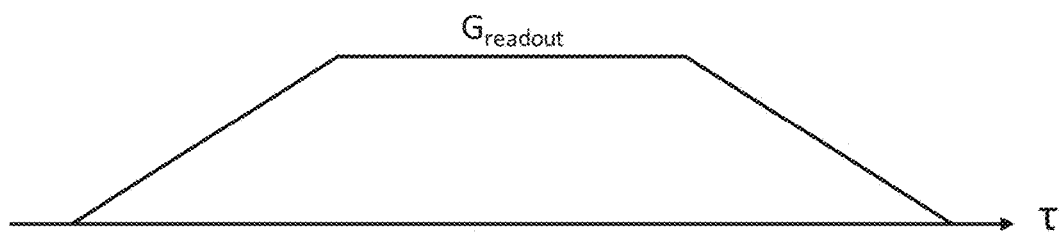
FIG. 4A is an example of a targeted trapezoidal gradient.
Figure 4B:
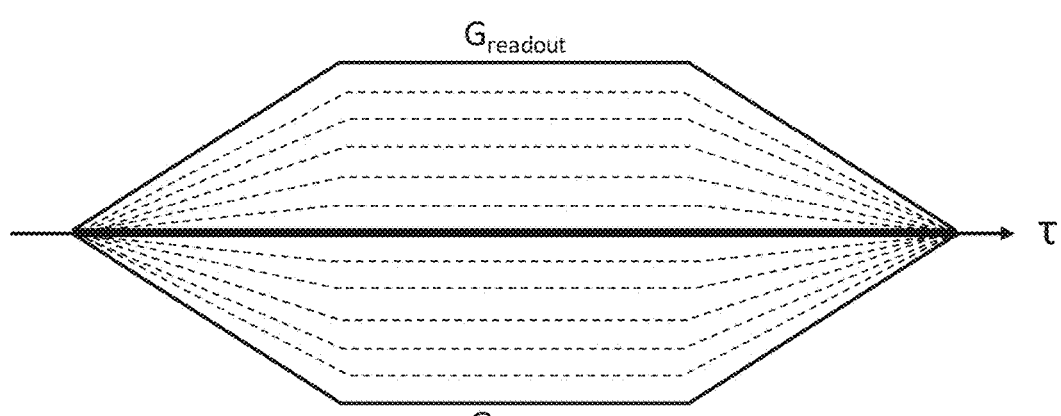
FIG. 4B is an example of an SPI encoding gradient based on the target gradient of FIG. 4A in accordance with the present disclosure
Figure 4C:
FIG. 4C is a RF transmission and data acquisition pulse sequence in accordance with the present disclosure.

In particular, referring to FIG. 3, an example of a process 300 in accordance with the present disclosure can be conceptualized as being formed of three components. In particular, the process 300 includes a data acquisition process 302, a FOV scale search process 304, and k-space trajectory process 306. The data acquisition process 302 can include an SPI acquisition along each of the x-, y- and z-axis, 308, 310, 312. The number of phase encodings ($N_p$) that may be used for the data acquisition process 302 or, more particularly, a minimum number of phase encodings needed for a particular gradient measurement can be determined by considering the FOV needed for a desired imaging application ($fov_D$), the gradient amplitude ($G(\tau)$,) and the maximum encoding time, as in the following:

$$N_p = \left\lceil fov_D \bar{\gamma} \max\left( \int_0^t G(\tau) d\tau \right) \right\rceil, \text{ where } 0 \le t < T; \quad (4)$$

where T is the end of readout. FIGS. 4A-4C, together, provide an example of SPI encoding to measure a trapezoidal readout gradient. In particular, FIG. 4A provides an example of a targeted gradient form. Based on the targeted trapezoidal gradient of FIG. 4A, the SPI encoding gradient of FIG. 4B is created, which yields the data acquisition pulse sequence illustrated in FIG. 4C. As illustrated, 1D SPI sampling can be implemented by linearly scaling a targeted gradient amplitude over TR. Data can be acquired using the same acquisition window as desired for imaging.

Referring again to FIG. 3, with the number of phase encodings determined and the SPI pulse sequence prepared, SPI data is acquired long each of the x-, y- and z-axis, 308, 310, 312. That is, the SPI data may be acquired in one dimension (1D SPI) by linearly scaling with $N_p$ steps along, for example, the entire gradient waveform, and a single axis to obtain $N_p \times 1$ data.

1D single point images can be reconstructed without calibration. The three sets of 1D projection images derived from the acquisition along each axis 308, 310, 312 and across a range of encoding time can be reconstructed at native FOVs, exhibiting the zoom-in effect. The size of the object increases with encoding time. The speed of the FOV change is proportional to the gradient strength, exhibiting acceleration in ramping up, constant change in plateau, and deceleration in ramping down. Therefore, as will be described, the gradient waveform can be calibrated by computing a scaling factors between neighboring phase encoding time delays within the 1D images.

Turning to the FOV scale search process 304, the output 314, which represents the relative FOV scaling factor (and can include an indication of k-space translation 315), directly reflects the relative k-space trajectory with respect to the reference encoding time, $t_r$, as follows:

$$FOVscale(t) = \frac{FOV(t)}{FOV(t_r)} = \frac{\bar{\gamma} \int_0^t G(\tau) d\tau}{\bar{\gamma} \int_0^{t_r} G(\tau) d\tau} = \frac{k(t)}{k(t_r)}; \quad (5)$$

where t denotes a phase encoding time delay, and k(t) is a k-space position in the unit of cycle $m^{-1}$ at encoding time, t. There are multiple approaches that may be used to estimate the local FOV scaling factor. As will be explained, these approaches may be used independently or in concert. For example approaches include a k-space domain approach 316 or an image domain approach 318. These can be formulated as a minimization problem, whether together or separately.

For example, k-space-based optimization can be performed as follows:

$$FOVscale(t) = \quad (6)$$

$$\frac{FOV(t)}{FOV(t_r)} = \operatorname{argmin}_s \left( \sum_{n=1}^{N_p} \left| K(t, n) - K\left(t_r, \frac{1}{s}\left(n - \left\lceil \frac{N_p}{2} \right\rceil\right) + \left\lceil \frac{N_p}{2} \right\rceil\right) \right|^p \right)^{\frac{1}{p}};$$

where K(t, n) denotes the magnitude of the k-space value encoded at phase encoding time t in 1D SPI, and s is a real number that is local FOV scaling factor.

Image domain optimization can be performed as follows:

$$FOVscale(t) = \quad (7)$$

$$\frac{FOV(t)}{FOV(t_r)} = \operatorname{argmin}_s \left( \sum_{x=1}^{N} |I(t, x) - I(t_r, s(x - N_c) + N_c)|^p \right)^{\frac{1}{p}};$$

where I(t,x) denotes the magnitude of 1D image at encoding time t and spatial position x, N is 1D matrix size, and $N_c$ is index for the center of image (e.g., for matrix size=N, $N_c=\lceil N/2 \rceil$).

The above equation 6 and 7 show minimization for $l_p$-norm of error between sampled and scaled k-space or image. When scaling k-space or image, a variety of interpolation methods can be used such as linear or bi-linear interpolation, to name a few.

Figure 5A:
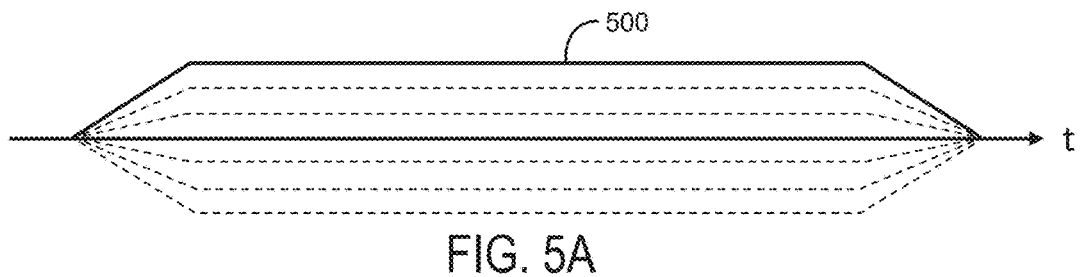
FIG. 5A is a graphic illustrating SPI encoding gradient in accordance with the present disclosure.
Figure 5B:
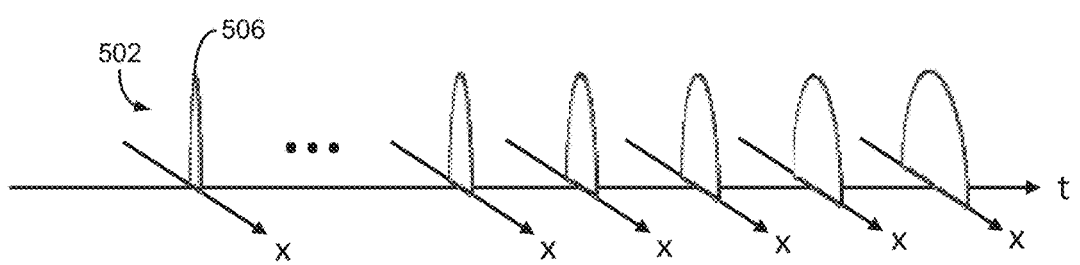
FIG. 5B is a graphic illustrating image domain data acquired using the SPI encoding gradient of FIG. 5A.
Figure 5C:
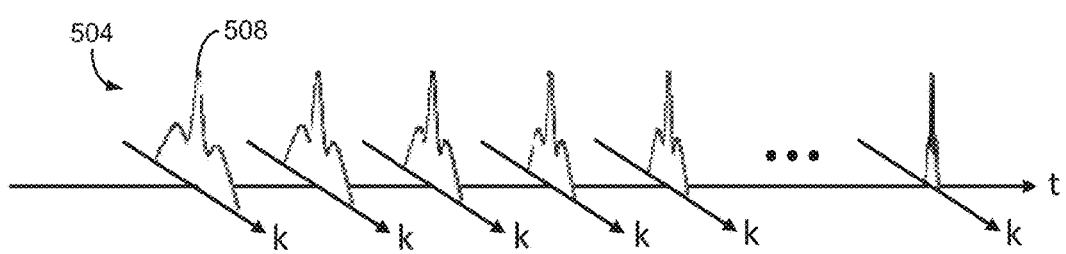
FIG. 5C is a graphic illustrating k-space domain data acquired using the SPI encoding gradient of FIG. 5A.
Figure 5D:
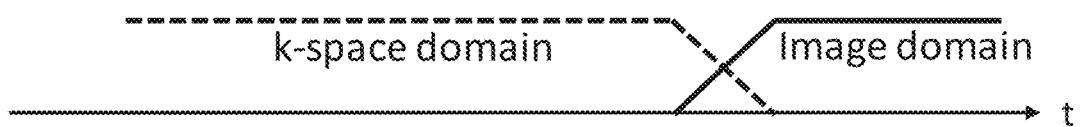
FIG. 5D is a graphic illustrating a merging filter in accordance with the present disclosure.

Referring to FIGS. 5A-5D, together, illustrate the process for acquiring image and k-space domain data using an SPI acquisition in accordance with the present disclosure. In particular, FIG. 5A illustrates SPI encoding gradient 500 that may be used during an SPI acquisition to acquire image domain data 502 illustrated in FIG. 5B, which corresponds to k-space domain data 504 illustrated in FIG. 5C. As illustrated, the 1D profile in the image domain has more resolution when the FOV is small, such as illustrated at profile 506. However, when the FOV is small, such as at profile 506, the k-space profile shows a broader line-shape, such as at profile 508. The converse is also true, as illustrated in FIGS. 5B and 5C. Accordingly, as shown in FIG. 5D, the two estimates may be combined. As shown in FIGS. 3 and 5D, the combination may be achieved using a merging filter 319. Alternatively, image or k-space domain data, or various weighted combinations thereof, can be used for FOV scaling search. As a non-limiting example, the combination of image and k-space data may be adaptively performed according to the FOV at encoding time.

Continuing with respect to FIG. 3, once the FOV scale search 304 is complete, the k-space trajectory can be evaluated. As shown in equation 5 above, the estimated FOV scaling factor, FOVscale(t), represents the relative k-space position at encoding time t with respect to the k-space position at the reference encoding time $t_r$. Thus, the acquired data and the relationships of equation 5 can be used to evaluate the relative trajectory at process block 320. The absolute k-space trajectory can be estimated using a priori information from the known gradient shape or the prescribed trajectory. The $1^{st}$ derivative of FOV scaling factors can be calculated as follows:

$$\frac{\partial FOVscale(t)}{\partial t} = \frac{\partial}{\partial t}\frac{k(t)}{k(t_r)} = \frac{\bar{\gamma}}{k(t_r)}G(t) = \alpha G(t); \quad (8)$$

where the calculated $1^{st}$ derivative is a scaled version of actual gradient amplitude with scaling factor, $\alpha=\bar{\gamma}/k(t_r)$. Then, the scaling factor can be estimated by using the known information of the prescribed gradient. For example, if $G_{max}$ is known, k can be estimated as:

$$\alpha = \frac{\max\left(\frac{\partial FOVscale(t)}{\partial t}\right)}{G{max}}. \quad (9)$$

Now, the absolute FOV at $t_r$, $k(t_r)$, can be recovered using the scaling factor k. Hence, the relative FOV scaling factor can be converted to the absolute k-space trajectory at process block 322, as follows:

$$k(t) = k(t_r)FOVscale(t) = \frac{\bar{\gamma}}{\alpha}FOVscale(t). \quad (10)$$

With the k-space trajectory achieved determined, a report 324 can be generated that, for example, may combine the absolute trajectory 322 and the k-space translation 310 because the k-space translation term 310 can be used to compensate for time-varying k-space shift. The report 324 may provide a measure of the actual gradient field generated by the plurality of gradient coils when controlled to produce the prescribed gradient field. To this end, as will be described, the report 324 may be used in a variety of ways to improve images acquired using a variety of pulse sequences and sampling (both Cartesian and non-Cartesian).

In practice, any of a variety of non-linear optimization methods can be used to solve equations 6, 7, and 10. In one study, simple unconstrained optimization (Nelder-Mead Simplex) was used to estimate the FOV scaling factors in both the k-space and image domain. In this study, the relative FOV scaling factor search 304 was performed with the reference encoding time, tr, selected by referring to the prescribed trajectory. To allow accurate estimation, $t_r$ was differently set in each k-space or image domain, so that k-space or image magnitude has enough resolution at each $t_r$.

The prescribed k-space trajectory may be used as an initial guess for the optimization. Once the FOV scaling factors are estimated in k-space and image domain, they may be combined using, for example a merging filter, and the absolute k-space trajectory can be computed by scaling based on the amplitude of the prescribed gradient. After estimating trajectories for the sampled k-space data, a convolution gridding reconstruction can be used, such as described in Pipe J G. Reconstructing MR images from undersampled data: data-weighting considerations. Magn. Reson. Med. 2000; 43:867-75; Pipe J G, Menon P. Sampling density compensation in MRI: rationale and an iterative numerical solution. Magn. Reson. Med. 1999; 41:179-86; Johnson K O, Pipe J G. Convolution kernel design and efficient algorithm for sampling density correction. Magn. Reson. Med. 2009; 61:439-47. doi: 10.1002/mrm.21840; and Beatty P J, Nishimura D G, Pauly J M. Rapid gridding reconstruction with a minimal oversampling ratio. IEEE Trans. Med. Imaging 2005; 24:799-808. doi: 10.1109/TMI.2005.848376, each of which is incorporated herein by reference in its entirety.

$B_0$ field inhomogeneity results in time-changing, phase-modulation in the image domain and time-shifting k-space in the frequency domain. The inhomogenous field may cause errors in the k-space trajectory estimation if only gradient distortion (e.g., distortion caused by eddy current effect) is taken into account. In conventional methods used to correct the B0 in homogeneity, multiple images at different TEs are first obtained, and a field map is estimated using the images under the assumption of linear phase, and then k-space trajectory can be adjusted based on the estimated field map. In contrast, the systems and methods of the present disclosure allow direct measure of k-space shift in the calibration process without need of additional image acquisition to estimate a field map. For example, acquisitions with long readouts, requires the effect to be compensated to characterize the true sampling trajectory. To incorporate $B_0$ in homogeneity effect, at process block 3224 equation 6 may be optionally modified as:

$$(FOVscale(t), C(t)) = \quad (11)$$

-continued $$\operatorname{argmin}_{(s,c)} \left( \sum_{x=1}^{N_p} \left| K(t,n) - K\left(t_r, \frac{1}{s}\left(n - \left\lceil \frac{N_p}{2} \right\rceil - c\right) + \left\lceil \frac{N_p}{2} \right\rceil\right) \right|^p \right)^{\frac{1}{p}};$$

where c is a factor that describes how much k-space drifts is present with respect to the reference encoding time, which can be used to correct the k-space trajectory.

The SPI-based gradient measurement techniques, methods, and systems presented herein are performed by applying phase encoding to the desired gradient channel(s). To do so, minor modifications may be made to the targeted pulse sequence, such as an additional loop during which the gradient amplitude is scaled for each gradient channel measured. Thus, gradient waveform measurement can be added into existing sequences with little effort. Additionally, because 1D encoding is used, the SNR of the technique is quite high, particularly when compared to FEBM where a thin, off-centered slice needs to be appropriately selected within an object region to allow accurate calibration.

The techniques, methods and systems described herein can be used to improve the quality of reconstructed images. This is particularly important for non-Cartesian imaging where small k-space trajectory errors lead to significant artifacts. Another application is the use of the technique to measure trajectories in more conventional Cartesian acquisitions. For example, the above-described systems and methods can be used to significantly reduce scan time for rapid imaging sequences, such as time-of-flight (TOF) angiography, contrast-enhanced (CE) MRI sequences, breath-hold-requiring sequences, and single shot fast spin echo (for the reduction of echo spacing). Calibration would also improve robustness of multi-echo acquisitions, for example, such as Dixon-like chemical-shift encoding imaging techniques for water and fat quantification (i.e., Iterative Decomposition of Water and Fat With Echo Asymmetry and Least-Squares Estimation [IDEAL]), as well as echo planar imaging (EPI). In chemical-shift encoded imaging, such as IDEAL, a multi-echo bipolar readout can be improved by reconstructing to a measured trajectory, which reduces artifactual phase due to an inaccurate k-space trajectory. Furthermore, ramp sampling can be applied to reduce the total acquisition time by approximately 25%. The ability to perform a robust and rapid gradient measurement technique to enable ramp sampling, particularly for oblique slice orientations is beneficial to many MRI sequences, as non-limiting examples including fast gradient echo, echo-planar imaging, balanced steady state free precession, fast-spin echo, and the like, to provide scan time reductions (as a non-limiting example, 20-30%) with, at most, small effect upon SNR.

EXAMPLE

To evaluate the above-described systems and methods, in one study, three gradient-intensive sequences (ultrashort time echo (UTE), spiral, and multiecho bipolar gradient echo (GRE)) were tested to evaluate the efficacy of the new SPI-based gradient measurement scheme. In UTE, a center-out radial acquisition is used to minimize the achievable echo time and enable contrast for species with ultrashort T2*'s. To minimize the readout duration, the maximum possible gradient slew rate is utilized at the center of k-space, causing geometric distortion and artifacts if compensation efforts are not made. In spiral imaging, the gradient waveforms are simultaneously designed to operate within the peak gradient slew rate and peak gradient amplitude, which can be distorted by eddy current effects. Finally, multiecho bipolar GRE with ramp sampling was used to demonstrate robust reconstruction for quantitative fat-water imaging.

Ultra-short Echo Imaging

Figures 6A, 6B, 6C:
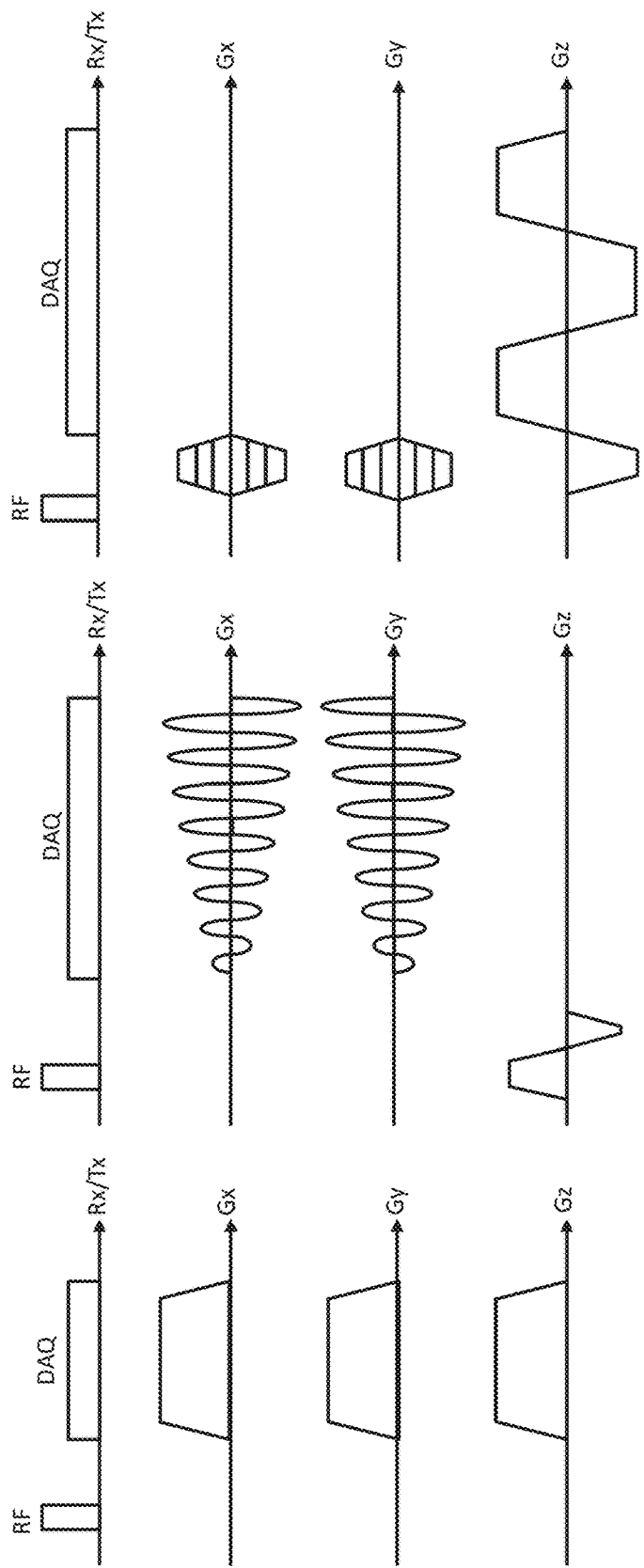
FIG. 6A is a pulse sequence diagram illustrating an ultra-short echo (UTE) imaging pulse sequence that may be used in accordance with the present disclosure.
FIG. 6B is a pulse sequence diagram illustrating a spiral imaging pulse sequence that may be used in accordance with the present disclosure.
FIG. 6C is a pulse sequence diagram illustrating a bipolar gradient echo (GRE) imaging pulse sequence that may be used in accordance with the present disclosure.

Radial UTE imaging was performed on a 3.0T MR scanner. k-space was imaged with a center out half radial trajectory, using the pulse sequence shown in FIG. 6A. After RF excitation using 24 us hard pulse with flip angle of 6 degrees, 80,000 spokes were scanned at an echo time (TE) of 90 us until the desired image resolution is achieved (with an encoding duration of 588 us). SPI-based gradient measurement was performed in x, y, and z direction with $N_p$=401. A repetition time (TR) of 3.3 ms was used. An image was reconstructed into FOV=24 $cm^3$ and 1 mm resolution using gridding. A human brain was scanned. A 15 cm spherical phantom was used for gradient measurement. The scan time to perform gradient measurement in all three gradient axes was 4 seconds.

Figure 7:
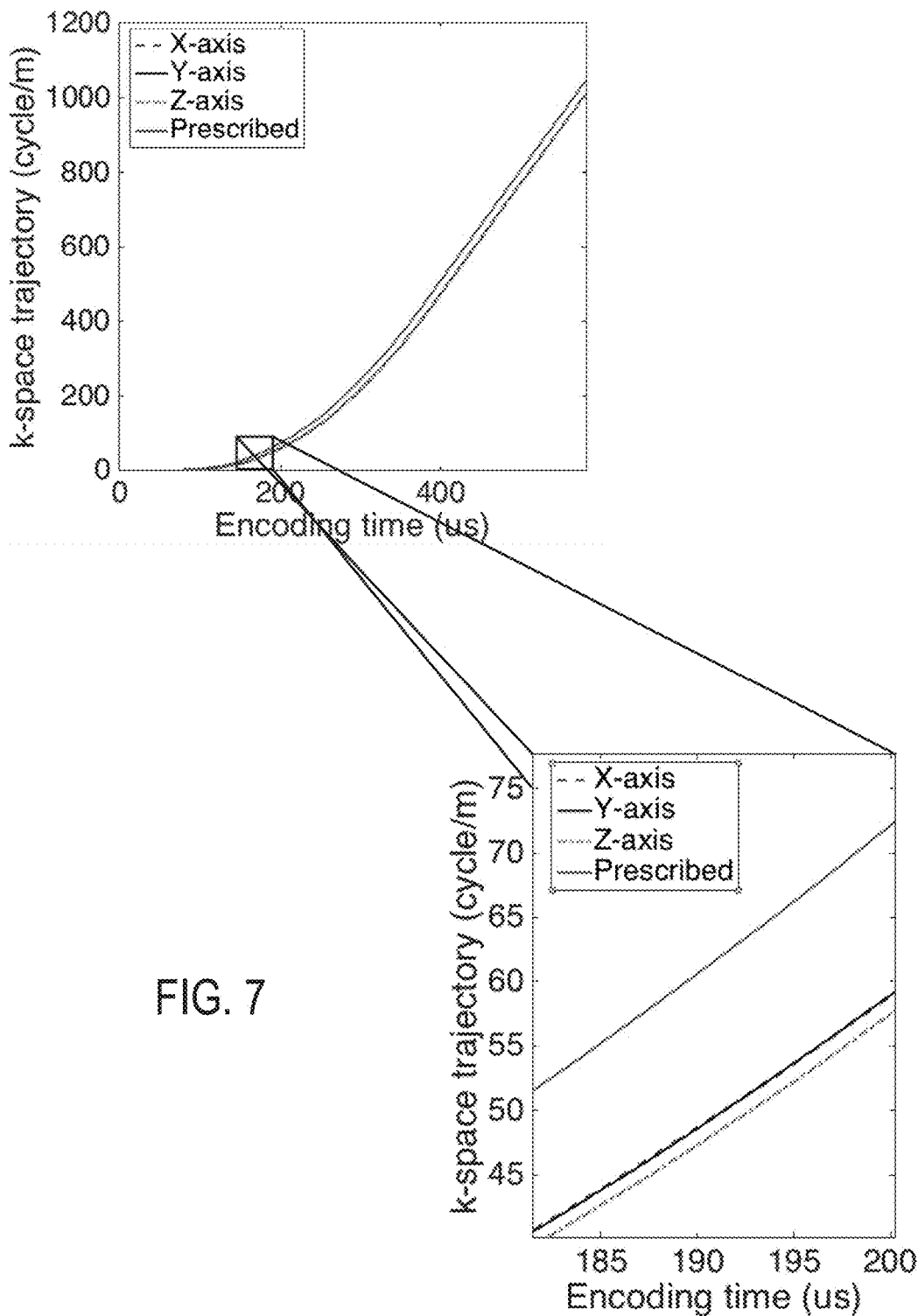
FIG. 7 is a graph showing prescribed and measured k-space trajectories and providing a zoomed-in portion thereof.

FIG. 7 is a graph that shows the measured trajectory in physical x, y, z axis, and prescribed trajectory, and a zoomed-in view in the graph. It is noted that the actual trajectory estimated by the systems and methods described herein shows delay compared with prescribed trajectory as expected. The image reconstructed with the measured trajectory showed good quality with no visible imaging artifact such as ringing, while the image with prescribed trajectory exhibited ringing and mis-aligned image components.

Spiral Imaging

Referring to FIG. 6B, a 2D spiral imaging pulse sequence was performed on a 1.5T MR scanner using the pulse sequence illustrated in FIG. 6B. A sinc pulse was used to achieve 30 degree flip angle in a single axial slice. 16 spiral arms with 990 readout points in an arm were encoded. The FOV was 24 $cm^3$ and the spatial resolution was 2 mm isotropic. The TR was 13 ms, and the TE was 2.42 ms. SPI acquisition with $N_p$=801 was performed in two different ways for comparison: extensive and quick. All 16 different pairs of x and y gradients were measured with extensive measurement (167 seconds), while 2 pairs of x and y gradients were measured and reproduced to estimated trajectories for all 16 arms using linear combination of them in a quick measurement (42 seconds). In the quick measurement, the k-space trajectory for other arms with rotational angle θ can be estimated, as follows:

$$\operatorname{traj}_x(\theta,t) = \cos\theta * \operatorname{traj}_{x,x}(t) - \sin\theta * \operatorname{traj}_{y,x}(t)$$

$$\operatorname{traj}_y(\theta,t) = \sin\theta * \operatorname{traj}_{x,y}(t) + \cos\theta * \operatorname{traj}_{y,y}(t) \qquad (12);$$

where $\operatorname{traj}_{a,b}(t)$ denotes measured k-space trajectory at encoding time t, which results from a gradient prescribed in b-axis. With (a,b)={(x,x),(x,y),(y,x),(y,y)}, 4 data sets were obtained. A 15 cm spherical phantom was used for gradient measurement, and a manufacturer-provided resolution phantom was scanned and reconstructed with the measured k-space trajectory. In the resulting images, quick gradient measurement showed a comparable result with the full measurement, while scan time for the quick measurement was 25% of the full measurement time.

Ramp Sampling

Referring to FIG. 6C, in the study for ramp sampling, non-selective 3D GRE imaging was performed on a 3.0T MR scanner, with 2 mm spatial resolution and FOV=6×20×26 $cm^3$. A 24 us hard pulse with flip angle of 6 degrees was used. Two vials containing either 0% and 50% fat with a $T_1$ shortening agent were used for the experiment. Two acquisitions using the pulse sequence shown in FIG. 6C were acquired, where a longer and shorter plateau of readout gradient was used for the conventional Cartesian sampling and ramp sampling, respectively. The minimum TR was 4.78 ms for Cartesian sampling and 3.65 ms for ramp sampling (a 24% reduction). Total 3 echoes were obtained using the bipolar gradients with TE=992, 1896, 2800 us for Cartesian sampling and 802, 1462, 2122 us for ramp sampling. Gradient measurement was performed in the readout direction with Np=401 and acquisition time for gradient measurement was 1.5 seconds. A 15 cm spherical phantom was used for gradient measurement. The Cartesian data was reconstructed with or without gradient measurement. To reduce reconstruction error in the non-ramp-sampled dataset, the measured gradient data was used to center-align k-space data between echoes. Data acquired with ramp sampling was reconstructed using the measured trajectory. After reconstructing multi echo images, Iterative Decomposition of Water and Fat With Echo Asymmetry and Least-Squares Estimation (IDEAL) was applied to obtain fat and water separated images, and the fat fraction was calculated.

Figure 8:
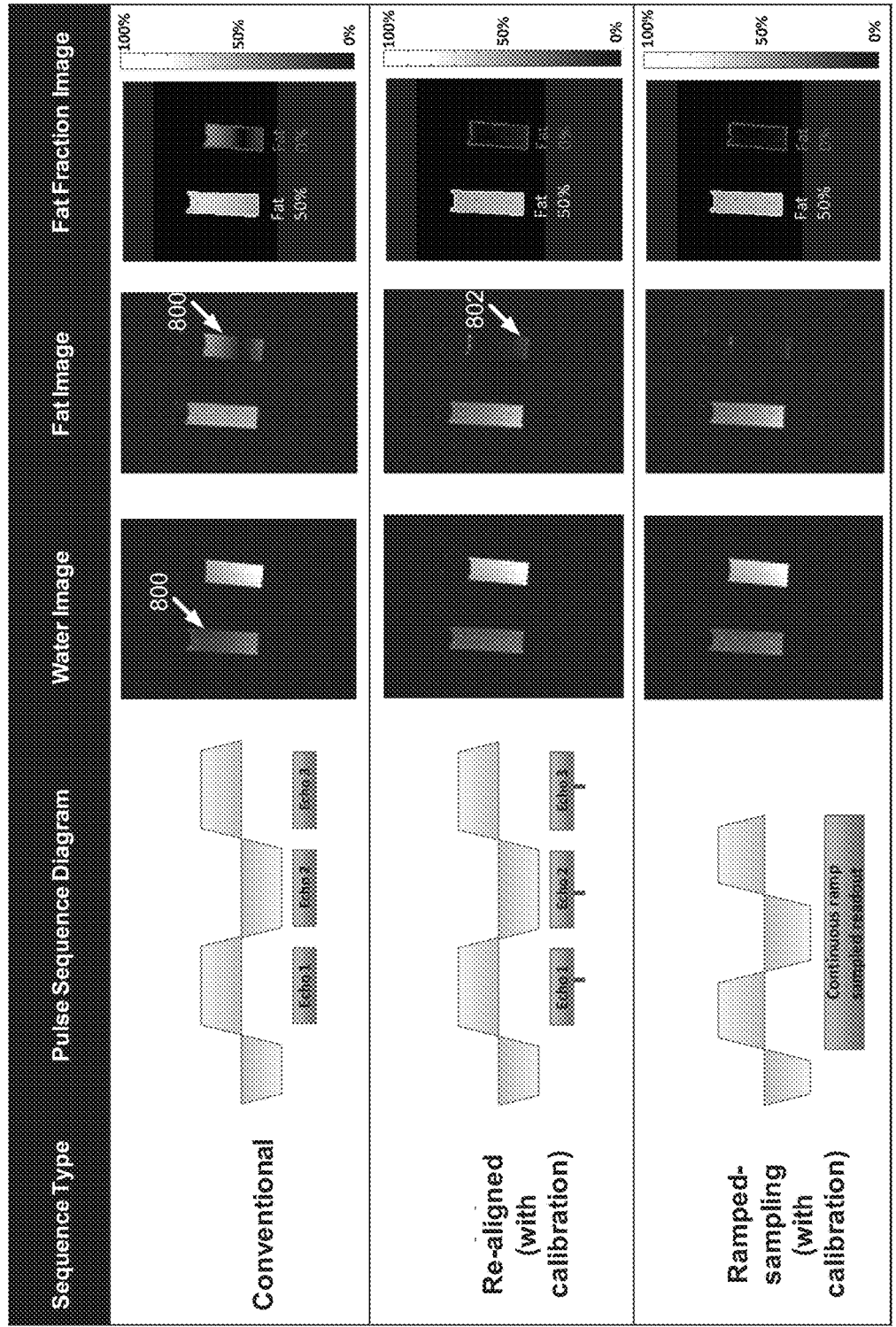
FIG. 8 is a table illustrating sampling and images relative to conventional Cartesian, center-aligned (based on gradient measurement) Cartesian, and ramp sampling.

FIG. 8 is a table that shows fat and water separated images and the resultant fat fraction map obtained by three different imaging schemes: conventional Cartesian imaging, center-corrected Cartesian imaging, and ramp sampling. In conventional Cartesian imaging, the estimated fat fraction was 59.2±5.9% and 20.8±12.4% for left and right vial, respectively. In the center-corrected Cartesian imaging, the estimated fat fraction was 53.0±2.8% and 6.5±5.2% for left and right vial, respectively, which is a more accurate result than the conventional method. In ramp sampling, the estimated fat fraction was 53.4±3.1% and 4.4±4.1% for left and right vial, respectively, which is a comparable result with the center-corrected Cartesian sampling, while the ramp sampling required 24% shorter imaging time (or TR). It is noted that the error in estimation that is apparent in Cartesian sampling 800 is removed in the methods using gradient measurement (re-aligned or ramped-sampling. The mis-estimated fat fraction 802 is not shown in ramp sampling, which is due to a combination of the improved accuracy in the k-space sampling position as well as the reduced echo spacing.

The SPI-based gradient measurement techniques, systems, and methods provided herein do not require any special hardware to be used or incorporated with the MRI system. This stands in substantial contrast to other reported methods for PEBM that have used specialized hardware, such as microcoils, as a necessary addition to the MRI system to achieve the PEBM method. Similarly, EPBM use external field probes relies on a undesirable addition of hardware to the MRI system. While these methods have been shown to be viable techniques to measure gradient waveforms, the use of external hardware may be cost prohibitive and site dependent. In contrast, the above described systems and methods do not rely on specialized or additional hardware. For example, a 15 cm spherical phantom was used to perform gradient waveform measurement. However, any object (including a human patient) can be used to perform gradient measurement. However, the imaged object should have definite boundaries (determined either by object size or coil sensitivity) to allow computation of the relative scale factors.

Compared with previously reported PEBM methods, where the number of RF pulses determines the resolution of estimated trajectory or gradient, the systems and methods described herein allow higher resolution sampling of the gradient waveform (determined by the sampling bandwidth of the readout event). Therefore, the k-space position can be directly estimated from the calibration without any interpolation using the identical sampling rate for image acquisition. Furthermore, acquisition of the gradient measurement can be extremely rapid when the scan TR is short (as a non-limiting example, about 1.5 seconds per gradient axis). These systems and methods, thus, enable robust in vivo measurement where a database calibration measurement (e.g., obtained using the 15 cm spherical phantom) can be used to provide robust estimates for rapid gradient measurements performed in vivo on human subjects. Gradient measurement time for longer readouts (e.g., spiral and echo-planar imaging) can be further reduced by sub-sampling the number of phase encoding steps, particularly when a database calibration measurement is used. Alternatively, the proposed technique can also be used as a calibration technique to estimate the GIRF, such as described in Vannesjo S J, Haeberlin M, Kasper L, Pavan M, Wilm B J, Barmet C, Pruessmann K P. Gradient system characterization by impulse response measurements with a dynamic field camera. Magn. Reson. Med. 2013; 69:583-93. doi: 10.1002/mrm.24263 and Vannesjo S J, Haeberlin M, Kasper L, Pavan M, Wilm B J, Barmet C, Pruessmann K P. Image reconstruction using the gradient impulse response for trajectory prediction. Magn. Reson. Med. 2013; 69:583-93. doi: 10.1002/mrm.24263, each of which is incorporated herein by reference in its entirety.

Thus, the present disclosure provides a new gradient measurement technique based on single point imaging (SPI), which allows simple, rapid, and robust measurement of k-space trajectory. This robust and rapid gradient measurement method based on SPI, which allows measurement of k-space trajectory with high temporal resolution, does not require additional hardware or equipment to be performed.

The present invention has been described in terms of one or more preferred embodiments, and it should be appreciated that many equivalents, alternatives, variations, and modifications, aside from those expressly stated, are possible and within the scope of the invention.

The invention claimed is:

1. A magnetic resonance imaging (MRI) system comprising:
    a magnet system configured to generate a polarizing magnetic field about at least a portion of a subject arranged in the MRI system;
    a plurality of gradient coils configured to apply a gradient field to the polarizing magnetic field;
    a radio frequency (RF) system configured to apply an excitation field to the subject and acquire MR image data therefrom;
    a computer system programmed to determining an actual gradient field generated by the plurality of gradient coils when controlled to produce a prescribed gradient field by:
    based on a desired gradient field, controlling the gradient coils to perform a phase encoding including a gradient that is scaled along each direction desired to be measured over a selected number of encoding times;
    controlling the RF system to acquire one-dimensional (1D) data using a prescribed k-space trajectory during the phase encoding;
    using the 1D data, determining scaling factors between encoding times that correlate to actual k-space trajectories achieved when controlling the gradient coils to perform the phase encoding based on the desired gradient field; and generating a report providing a measure of the actual gradient field generated by the plurality of gradient coils when controlled to produce the prescribed gradient field.

2. The MRI system of claim 1 wherein the computer system is further programmed to perform a single point imaging (SPI) pulse sequence to acquire the 1D data.

3. The MRI system of claim 1 wherein the computer system if further programmed to analyze a field of view (FOV) across the number of encoding times to determine zoom changes in the FOV.

4. The MRI system of claim 3 wherein the scaling factors are determined based on the zoom changes in the FOV across the number of encoding times.

5. The MRI system of claim 1 wherein the computer system is further programmed to utilize the report in future reconstructions to provide improved images by correcting for variances between the prescribed gradient field and the actual gradient field.

6. The MRI system of claim 1 wherein the computer system is further programmed to determine the scaling factor using the k-space data and images reconstructed from the k-space data to estimate the actual k-space trajectories.

7. The MRI system of claim 6 wherein the computer system is further programmed to determine the scaling factors in an image domain using the images and in the frequency domain using the k-space data.

8. The MRI system of claim 7 wherein the computer system is further programmed to combine the scaling factors in the image domain and the frequency domain.

9. The MRI system of claim 7 wherein the computer system is further programmed to combine the scaling factors using a merging filter and determine an absolute k-space trajectory based on an amplitude of the prescribed gradient field and the using the combined scaling factors.

10. The MRI system of claim 1 wherein the computer system is further programmed to determine the scaling factors includes using a prescribed k-space trajectory as a initialization.

11. The MRI system of claim 10 wherein the computer system is further programmed to determine an absolute k-space trajectory using a priori information from the prescribed gradient field or the prescribed k-space trajectory.

12. The MRI system of claim 1 wherein the computer system is further programmed to perform a convolution gridding reconstruction to create corrected images.

13. The MRI system of claim 1 wherein the computer system is further programmed to correct for inhomogeneities in the polarizing magnetic field when determining the scaling factors.

14. A method for determining an actual gradient field generated by a magnetic resonance imaging (MRI) system when controlled to produce a prescribed gradient field, the method comprising:

using the prescribed gradient field, controlling the MRI system to perform a phase encoding including a gradient that is scaled along each direction desired to be measured over a selected number of encoding times;

acquiring one-dimensional (1D) data using a prescribed k-space trajectory during the phase encoding;

using the 1D data, determining scaling factors between encoding times that correlate to actual k-space trajectories achieved when controlling the gradient coils to perform the phase encoding based on the desired gradient field; and generating a report providing a measure of the actual gradient field generated when controlling the MRI system to produce the prescribed gradient field.

15. The method of claim 14 wherein acquiring the 1D data includes performing a single point imaging (SPI) pulse sequence to acquire the 1D data.

16. The method of claim 14 further wherein determining the scaling factors includes analyzing a field of view (FOV) across the number of encoding times to determine zoom changes in the FOV.

17. The method of claim 14 further comprising utilizing the report in future reconstructions to provide improved images by correcting for variances between the prescribed gradient field and the actual gradient field.

18. The method of claim 14 wherein determining the scaling factor includes using the k-space data and images reconstructed from the k-space data to estimate the actual k-space trajectories.

19. The method of claim 14 further comprising determining an absolute k-space trajectory using a priori information from the prescribed gradient field or the prescribed k-space trajectory.

20. The method of claim 14 further comprising to correcting for inhomogeneities in the polarizing magnetic field when determining the scaling factors.

21. A method for determining a difference between an actual gradient field generated by a magnetic resonance imaging (MRI) system and a prescribed gradient field, the method comprising:

performing a pulse sequence using the MRI system that includes a single point imaging (SPI) acquisition to acquire imaging data over a plurality of encoding times;

analyzing a zoon-in/out effect using the imaging data to determine a relative field of view (FOV) scaling factor between the encoding times;

using the FOV scaling factor, determine relative k-space positions of at least one of the imaging data and to-be acquired imaging data; and generating an image using one of the imaging data and the to-be acquired imaging data and the relative k-space positions.

* * * * *

UNITED STATES PATENT AND TRADEMARK OFFICE
CERTIFICATE OF CORRECTION

PATENT NO. : 10,338,180 B2
APPLICATION NO. : 14/881093
DATED : July 2, 2019
INVENTOR(S) : Alan B. McMillan et al.

Page 1 of 1

It is certified that error appears in the above-identified patent and that said Letters Patent is hereby corrected as shown below:

In the Specification

Column 8, Eq. (6) " $\sum_{n=1}^{N_p}$ " should be -- $\sum_{n=1}^{N_p}$ --.

Column 8, Eq. (7) " $\sum_{n=1}^{N_p}$ " should be -- $\sum_{n=1}^{N_p}$ --.

Column 11, Eq. (11) " $\sum_{n=1}^{N_p}$ " should be -- $\sum_{n=1}^{N_p}$ --.

Signed and Sealed this
Twenty-ninth Day of October, 2019

Andrei Iancu
*Director of the United States Patent and Trademark Office*